(12) United States Patent
Yang et al.

(10) Patent No.: US 12,160,977 B2
(45) Date of Patent: Dec. 3, 2024

(54) LIQUID COOLED PLATE AND ELECTRONIC COMPUTING DEVICE

(71) Applicant: SHENZHEN ENVICOOL TECHNOLOGY CO., LTD., Guangdong (CN)

(72) Inventors: Xi Yang, Guangdong (CN); Zhao Lu, Guangdong (CN); Kailun Zhang, Guangdong (CN); Weiyang Lai, Guangdong (CN); Lichuan Wei, Guangdong (CN); Zhiqiang Cai, Guangdong (CN)

(73) Assignee: SHENZHEN ENVICOOL TECHNOLOGY CO., LTD., Guangdong (CN)

( * ) Notice: Subject to any disclaimer, the term of this patent is extended or adjusted under 35 U.S.C. 154(b) by 267 days.

(21) Appl. No.: 17/745,908

(22) Filed: May 17, 2022

(65) Prior Publication Data

US 2022/0377940 A1    Nov. 24, 2022

(30) Foreign Application Priority Data

May 20, 2021    (CN) .......................... 202110552869.7

(51) Int. Cl.
  *H05K 7/20* (2006.01)
  *G06F 1/20* (2006.01)
(52) U.S. Cl.
  CPC .......... *H05K 7/20254* (2013.01); *G06F 1/20* (2013.01)
(58) Field of Classification Search
  CPC . H05K 7/20254; G06F 1/20; G06F 2200/201; Y02E 60/10; H01L 23/3672; H01L 23/473; H01L 23/367
  See application file for complete search history.

(56) References Cited

U.S. PATENT DOCUMENTS 4,884,168 A * 11/1989 August .............. H05K 7/20254
                                                174/15.1
8,339,785 B2 * 12/2012 Chang ................ H05K 7/20927
                                                165/80.4

(Continued)

FOREIGN PATENT DOCUMENTS

CN       109728381 A   *  5/2019
CN       211789383 U   * 10/2020

(Continued)

OTHER PUBLICATIONS

Nishihara Atsuo; Ashiwake Noriyki, Idei Akio, Daikoku Takahiro, "Electronic Device", Mar. 23, 2000, Entire Document (Translation of WO 0016397) (of record, cited in the IDS, including Original Copy). (Year: 2000).*

(Continued)

*Primary Examiner* — Stephen S Sul
(74) *Attorney, Agent, or Firm* — Yue (Robert) Xu; Apex Attorneys at Law, LLP

(57) ABSTRACT

A liquid cooled plate and an electronic computing device are provided. The liquid cooled plate includes multiple channels communicated in sequence, and adjacent channels are communicated via a communicating portion. Multiple partitions divide each of the channels to multiple flow passages, and a part of each of the partitions extends into the communicating portion, and lengths of the multiple partitions extending into the communicating portion gradually increases or decreases according to a preset rule. With this arrangement, the coolant can be collected and redistributed before entering the next channel, which is more conducive to the uniform distribution of the coolant, thereby improving the overall heat exchange capacity of the liquid cooled plate, and thus can better meet the actual usage requirements.

14 Claims, 4 Drawing Sheets

(56) References Cited

U.S. PATENT DOCUMENTS

| | | | | |
|---|---|---|---|---|
| 8,933,557 | B2* | 1/2015 | Gohara | H01L 23/473 |
| | | | | 165/185 |
| 2002/0011327 | A1 | 1/2002 | Fukazu et al. | |
| 2010/0238629 | A1* | 9/2010 | Shiba | H01L 23/473 |
| | | | | 361/699 |
| 2010/0326750 | A1* | 12/2010 | Murakami | H01L 25/072 |
| | | | | 165/185 |

FOREIGN PATENT DOCUMENTS

| | | | |
|---|---|---|---|
| CN | 111883875 | A | 11/2020 |
| JP | 2017044592 | A | 3/2017 |
| WO | 0016397 | A1 | 3/2000 |

OTHER PUBLICATIONS

He Liang, Han Haibin, An Yilu, "Liquid-cooling plate and optimization for liquid-cooling plate design", May 7, 2019, Guangzhou Xpeng Automobile Tech Co Ltd, Entire Document (Translation of CN 109728381). (Year: 2019).*

Liu Chao, Yang Congmei, Li Liguo, Lu Yong, "Liquid cooling plate for battery pack", Oct. 27, 2020, Suzhou Keyi New Power Tech Co Ltd, Entire Document (Translation of CN 211789383). (Year: 2020).*

Search Report dated Oct. 11, 2022 for European patent application No. 22166037.6.

* cited by examiner

LIQUID COOLED PLATE AND ELECTRONIC COMPUTING DEVICE

CROSS REFERENCE TO RELATED APPLICATIONS

This application claims the priority to Chinese Patent Application No. 202110552869.7 titled "LIQUID COOLED PLATE AND ELECTRONIC COMPUTING DEVICE", filed with the China National Intellectual Property Administration on May 20, 2021, which is incorporated herein by reference in its entirety.

FIELD

The present application relates to the technical field of heat dissipation for electronics, and in particular to a liquid cooled plate and an electronic computing device.

BACKGROUND

As the technology develops, the power of semiconductor chips continuously increases, and requirements for liquid cooled plates are getting higher and higher. Generally, the liquid cooled plate includes multiple mutually connected channels, and each of the channels has multiple flow passages. When the coolant enters the flow passages, it may be distributed unevenly, resulting in a situation that there's relatively more coolant in some flow passages while insufficient coolant in other flow passages, which affects the heat dissipation efficiency and temperature distribution uniformity of the liquid cooled plate.

SUMMARY

A liquid cooled plate and an electronic computing device are provided according to the present application, which provides a new structure of liquid cooled plate.

A liquid cooled plate is provided according to embodiments of the present application, where multiple channels are formed in the liquid cooled plate, and the multiple channels are communicated in sequence; multiple partitions spaced apart from each other and extending in a liquid flow direction are arranged in each of the multiple channels, each two adjacent channels are in communication with each other via a communicating portion, a part of each of the multiple partitions in each of the multiple channels extends into the communicating portion, and lengths of the parts of the multiple partitions extending into the communicating portion gradually increases or gradually decreases in sequence in a preset direction.

In an embodiment, in the liquid flow direction, at least one end of each of the partitions of each of the channels has a guide portion.

In an embodiment, at least one of the communicating portions is provided with a communicating portion partition, and a preset distance is provided between the partitions of each of the channels in communication with the communicating portion and the communicating portion partition in the communicating portion.

In an embodiment, the liquid cooled plate further includes a liquid inlet and a liquid outlet, the channels in communication with the liquid inlet are arranged along a peripheral direction of the liquid cooled plate to form a preset area, and channels in communication with the liquid outlet are located in the preset area.

In an embodiment, the liquid inlet and the liquid outlet are located on a same side of the liquid cooled plate, and one of the multiple channels which is in direct communication with the liquid inlet and one of the multiple channels which is in direct communication with the liquid outlet are arranged adjacently to each other.

In an embodiment, the liquid cooled plate includes a liquid inlet and a liquid outlet, the partitions in one of the multiple channels which is in direct communication with the liquid inlet includes a first partition, a second partition and a third partition, and the first partition and the second partition are located at opposite sides of the third partition respectively. There are multiple first partitions and second partitions, among the first partitions, the greater a distance between one first partition and the third partition is, the greater a distance between the first partition and the liquid inlet is; among the second partitions, the greater a distance between one second partition and the third partition is, the greater a distance between the second partition and the liquid inlet is.

In an embodiment, a thickness of the third partition is greater than that of the first partition or that of the second partition; among the first partitions, the greater a distance between one first partition and the third partition is, the smaller a thickness of the first partition is; among the second partitions, the greater a distance between one second partition and the third partition is, the smaller a thickness of the second partition is.

In an embodiment, cross-sectional areas of the multiple channels decrease in sequence in the liquid flow direction according to a preset rule. In an embodiment, a cross-sectional area of each of the multiple channels decreases in the liquid flow direction.

In an embodiment, densities of distribution of the partitions of in the multiple channels gradually increase along the liquid flow direction according to the preset rule.

An electronic computing device is further provided according to the embodiments of the present application, where the electronic computing device includes multiple heat sources and the liquid cooled plate according to any one of the above solutions, where the liquid cooled plate is configured to dissipate heat from the multiple heat sources.

The present application relates to a liquid cooled plate and an electronic computing device. The liquid cooled plate includes multiple channels that are communicated in sequence, and adjacent channels are communicated via a communicating portion. Multiple partitions divide each of the channels into multiple flow passages, a part of each of the partitions extends into the communicating portion, and lengths of the multiple partitions extending into the communicating portion gradually increase or gradually decrease according to a preset rule. With this arrangement, the coolant can be collected and redistributed before entering the next channel, which is more conducive to the uniform distribution of the coolant, and improves the overall heat exchange capacity of the liquid cooled plate, which can better meet the actual usage requirements.

It could be understood that the foregoing general descriptions and the following detailed descriptions are only exemplary, and cannot limit the present application.

BRIEF DESCRIPTION OF THE DRAWINGS

For more clearly illustrating embodiments of the present application or the technical solutions in the conventional technology, drawings referred to describe the embodiments or the conventional technology will be briefly described hereinafter. Apparently, the drawings in the following description are only some examples of the present application, and for those skilled in the art, other drawings may be obtained based on these drawings without any creative efforts.

Figure 1:
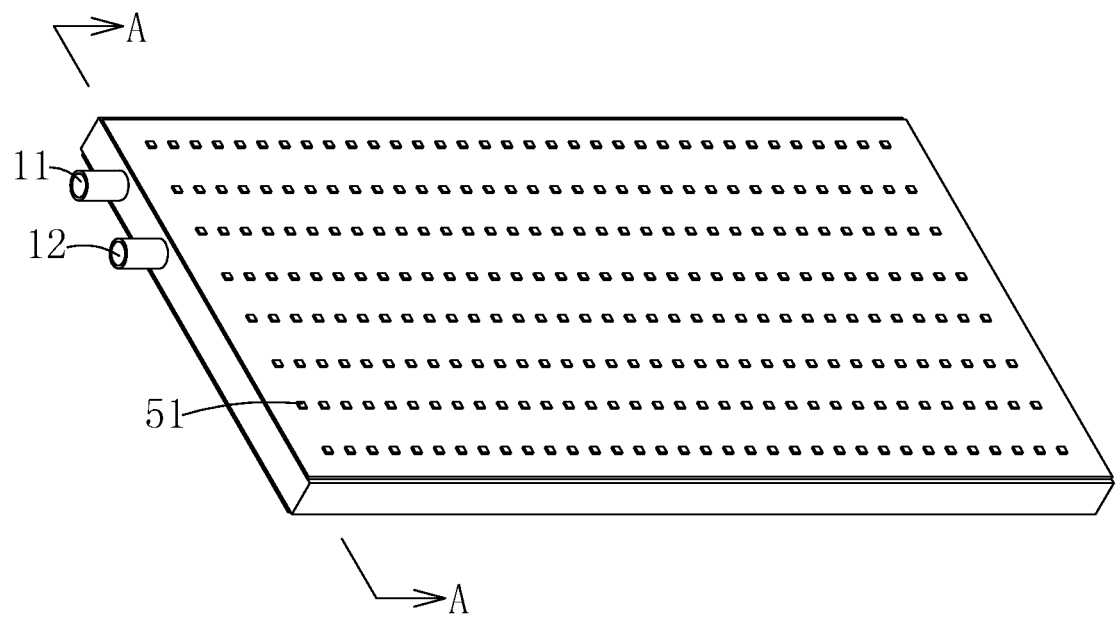
FIG. 1 is a schematic view showing the structure of a liquid cooled plate according to an embodiment of the present application.

Reference numerals in FIGS. 1 to 8:

| 1 | channel; | 11 | liquid inlet; |
|---|---|---|---|
| 12 | liquid outlet; | 13 | first channel; |
| 14 | second channel; | 15 | third channel; |
| 16 | fourth channel; | 17 | fifth channel; |
| 2 | partition; | 2' | communicating portion partition; |
| 21 | first partition; | 22 | second partition; |
| 23 | third partition; | 24 | guide portion; |
| 3 | communicating portion; | | |
| 4 | isolating portion; | | |
| 5 | chip set; | 51 | chip. |

DETAILED DESCRIPTION OF THE EMBODIMENTS

In order to better understand the technical solutions of the present application, the embodiments of the present application are described in detail below with reference to the accompanying drawings.

It is apparent that the described embodiments are only a part of the embodiments of the present application, rather than all of the embodiments. Any other embodiments obtained by those skilled in the art based on the embodiments in the present application without any creative effort shall fall within the protection scope of the present application.

The terminology used in the present application is only for purpose of describing the specific embodiments, and is not intended to limit the present application. The terms "a/an", "the said", and "the" in a singular form used in the embodiments of the present application and the appended claims are intended to include a plural form, unless other meanings are clearly indicated in the context.

It should be understood that the term "and/or" used in the present application is only an association relationship to describe the associated objects, indicating that there may be three kinds of relationships, for example, A and/or B may indicate three cases, such as A exists alone, A and B exist at the same time, and B exists alone. In addition, the character "/" in this specification indicates that the associated objects before and after the character "/" are in an "or" relationship.

It should be noted that the directional words such as "up", "down", "left", and "right" in the embodiments of the present application are described based on the perspective angle shown in the drawings, and should not be construed as limitation on the embodiments of the present application. In addition, it should also be understood that when an element is referred to as being connected "on" or "under" another element, it means that the element may be directly connected "on" or "under" the another element, or may also be indirectly connected "on" or "under" the another element by an intermediate element.

As the technology develops, the power of semiconductor chips continuously increases, and requirements for liquid cooled plates are getting higher and higher. Generally, the liquid cooled plate includes multiple mutually connected channels, and each of the channels has multiple flow passages. When a coolant enters the flow passages, it may be distributed unevenly, resulting in a situation that there's relatively more coolant in some flow passages while insufficient coolant in other flow passages, moreover, since different flow passages have different heat exchanging areas for heat exchange with heat sources, the overall utilization rate of the coolant decreases due to insufficient coolant, which affects the heat dissipation efficiency and temperature distribution uniformity of the liquid cooled plate.

In view of this, a liquid cooled plate and an electronic computing device are provided according to the embodiments of the present application, which provides a new structure of liquid cooled plate.

Figure 2:
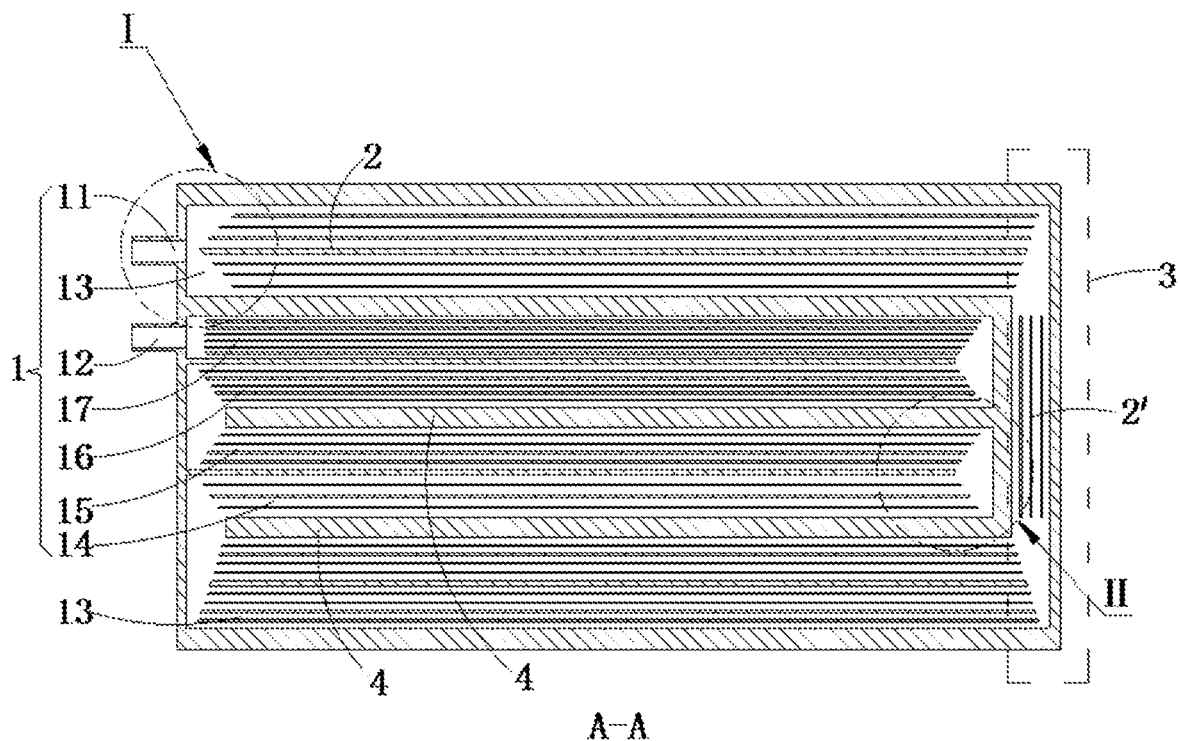
FIG. 2 is a cross-sectional view of FIG. 1 taken along line A-A.
Figure 4:
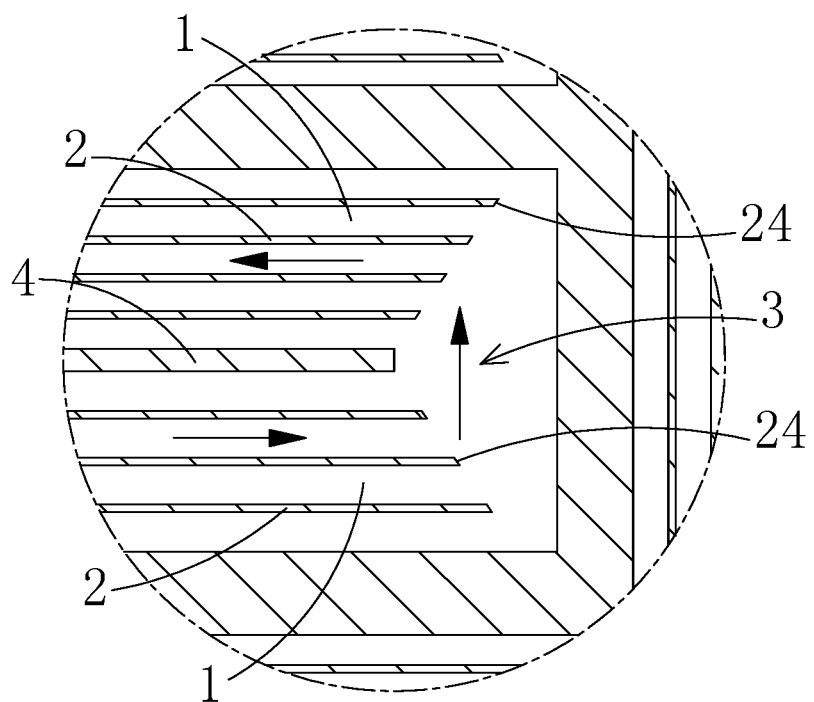
FIG. 4 is a partially enlarged view showing a portion II in FIG. 2.

Reference is made to FIG. 1, a liquid cooled plate is provided according to an embodiment of the present application. As shown in FIG. 2, the liquid cooled plate includes multiple channels 1 communicated in sequence, and adjacent channels 1 may be connected end to end, so as to form a coolant flow path in the liquid cooled plate. The channels 1 may be integrally formed on a bottom plate, for example, the channels 1 may be produced by milling process or the like; or the channels may be formed by providing an isolating portion 4 for separation, for example, the isolating portion 4 may be embodied as partition plates, and the channels 1 are formed by welding the partition plates. The adjacent channels 1 are in communication with each other via a communicating portion 3, which is shown by the broken lines in FIG. 2. The communicating portion 3 may be integrally formed with the channels 1 on the bottom plate of the liquid cooled plate. Multiple partitions 2 are arranged in each of the channels 1, to separate each of the channels 1 into multiple flow passages. Specifically, a part of each of the partitions 2 of each of the channels 1 extends into the communicating portion 3. Lengths of the parts, extending into the communicating portion 3, of the multiple partitions 2 in each of the channels 1 gradually increase or gradually decrease according to a preset rule. Specifically, the above lengths increase or decrease in sequence in a preset direction. More specifically, in a specific solution, as shown in FIG. 4, the black arrows show a flow direction of a coolant, the coolant flows from a former channel 1 into a latter channel 1, and the lengths of the parts of the multiple partitions 2 extending into the communicating portion 3 gradually increase in a direction away from the latter channel 1. Herein, the former channel 1 refers to an upstream channel, while the latter channel 1 refers to a downstream channel which is connected to the upstream channel via the corresponding communicating portion 3.

With this arrangement, after the coolant flows out of the former channel 1, the coolant can be collected and redistributed before entering the latter channel 1, so that the coolant can be redistributed before flowing into the flow passages, which is beneficial to uniform flowing of the coolant into the latter channel 1; in addition, a part of the coolant which performs insufficient heat exchange can be mixed with another part of the coolant which performs sufficient heat exchange, so that different parts of the coolant can exchange heat with each other, and the coolant can be redistributed after mixing, which is beneficial to improving the utilization efficiency of the coolant.

Specifically, along a direction away from the isolating portion 4, the lengths of the parts of the partitions 2 extending into the same communicating portion 3 gradually increase.

In this way, when the coolant flows into the communicating portion 3, the possibility of the coolant being interfered by the partitions 2 of adjacent flow channels can be reduced, which reduces the accumulation of the coolant in the flow passages, which is more conducive to the collection and distribution of the coolant in the communicating portion 3, thereby improving the overall heat exchange capacity of the liquid cooled plate.

As shown in FIG. 4, in an embodiment, in the liquid flow direction, at least one end of each of the partitions 2 is provided with a guide portion 24. Specifically, the guide portion 24 may be arranged at an end of the partition 2 extending into the communicating portion 3, the coolant can flow along the guide portion 24 to enter the corresponding flow passage.

With this arrangement, the distribution uniformity of the coolant flowing into the next channel is further improved, which is beneficial to improvement of the overall heat exchange capacity of the liquid cooled plate, the heat dissipation efficiency and the uniformity of temperature distribution.

As shown in FIG. 2, in an embodiment, at least one communicating portion 3 is provided with a communicating portion partition 2', and a preset distance is provided between the communicating portion partition 2' and the partitions 2 of each of the channels 1 in communication with the communicating portion 3. That is, the communicating portion partition 2' is not connected to the partitions 2 of the channel 1, and thus the coolant will be redistributed before entering the flow passages.

When a distance between the mutually connected channels 1 is relatively long, that is, when a length of the communicating portion 3 is relatively long, the communicating portion partition 2' may be provided in the communicating portion 3 to divide the communicating portion 3 into different flow passages, which is beneficial for uniform flowing of the coolant in the communicating portion, thereby reducing the possibility of uneven distribution of the coolant entering the flow passages of the next channel 1 caused by the coolant being concentrated on one side of the communicating portion 3 during flowing in the communicating portion 3.

As shown in FIG. 2, in an embodiment, the channels 1 of the liquid cooled plate may include a first channel 13 and a second channel 14, specifically, may include multiple first channels 13 and multiple second channels 14. The first channels 13 are arranged along a peripheral direction of the liquid cooled plate, which can form a preset area, and the second channels 14 are located in the preset area. That is, the first channels 13 surround the second channels 14. Specifically, the preset area is defined by the first channels 13 and the communicating portion 3 between the first channels 13. Specifically, the first channels 13 may be in communication with a liquid inlet 11 of the liquid cooled plate, the second channels 14 may be in communication with a liquid outlet 12 of the liquid cooled plate, and the coolant flows into the second channels 14 through the first channels 13.

Since the coolant absorbs the heat emitted by the heat sources during flowing, the temperature of the coolant in the first channels 13 is generally lower than the temperature of the coolant in the second channels 14. With this arrangement, the coolant with lower temperature (the coolant in the first channels 13) surrounds the coolant with higher temperature (the coolant in the second channels 14), and the coolant in the first channels 13 can exchange heat with the coolant in the second channels 14, thereby reducing the temperature of the coolant in the second channels 14, and reducing the temperature difference between the coolant in the first channels 13 and the coolant in the second channels 14, which is conducive to balancing the overall temperature of the liquid cooled plate, so that all the heat sources are in a similar temperature environment, thereby can better meet the actual usage requirements.

In an embodiment, channels 1 of the multiple channels which are in communication with the liquid inlet 11 of the liquid cooled plate is arranged along a peripheral direction of the liquid cooled plate to form a preset area, and other channels 1 of the multiple channels which are in communication with the liquid outlet 12 is located in the preset area. Specifically, as shown in FIG. 2, the channels 1 may further include a third channel 15, a fourth channel 16 and a fifth channel 17, etc., and the channels 1 are communicated in sequence. Specifically, the second channel 14, the third channel 15, the fourth channel 16 and the fifth channel 17 may be arranged in a serpentine shape in the area surrounded by the first channels 13. As shown in FIG. 2, in a specific arrangement of the channels 1, the liquid inlet 11 and the liquid outlet 12 are located on the same side of the liquid cooled plate, and the channels 1 which are in direct communication with the liquid inlet 11 and the channels 1 which are in direct communication with the liquid outlet 12 are arranged adjacently to each other, that is, as shown in FIG. 2, the fifth channel 17 is arranged to be adjacent to the first channel 13.

With this arrangement, when the coolant flows into the liquid cooled plate, it firstly flows along the peripheral direction of the liquid cooled plate, and then flows in the middle area of the liquid cooled plate, so that newly introduced coolant with lower temperature surrounds the coolant which has already exchanged heat with the heat source and with higher temperature, which facilitates the heat exchange between the low-temperature coolant and the high-temperature coolant, thereby improving the overall heat exchange efficiency of the coolant.

Specifically, as shown in FIG. 2, the liquid inlet 11 and the liquid outlet 12 may be arranged adjacent to each other. With this arrangement, the coolant in the channels 1 which are in direct communication with the liquid inlet 11 can perform heat exchange with the coolant in the channels 1 which are in direct communication with the liquid outlet 12, and the coolant in the liquid inlet 11 can be used for heat exchange with the heat source near the liquid outlet 12, thereby improving the heat dissipation capacity of an area near the liquid outlet 12 of the liquid cooled plate, and improving the heat dissipation efficiency of the liquid cooled plate, which can better meet the actual usage requirements.

Figure 3:
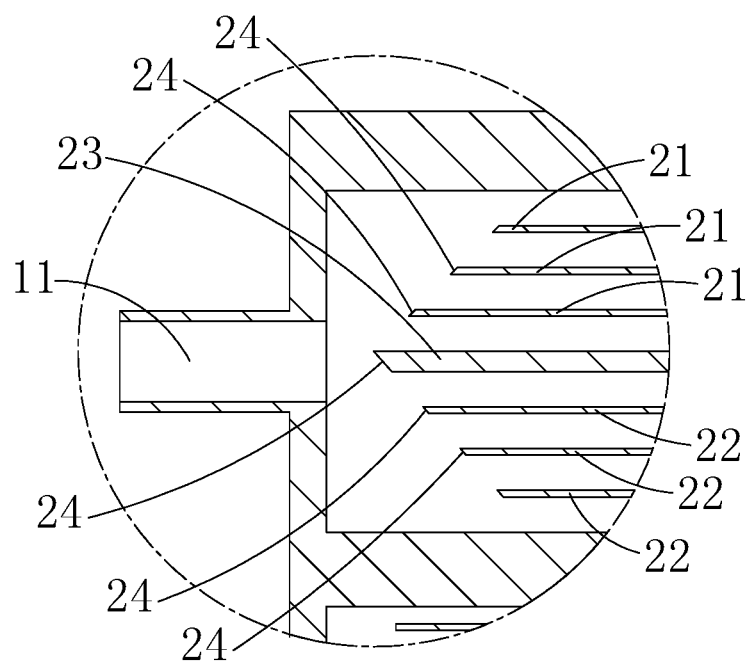
FIG. 3 is a partially enlarged view showing a portion I in FIG. 2.

As shown in FIG. 3, in an embodiment, a third partition 23 has a guide portion 24, and the guide portion 24 is configured to guide the coolant to flow toward a side close to the liquid outlet 12.

With this arrangement, more coolant can be distributed to the flow passages close to the liquid outlet 12, thereby improving the heat exchange capacity of the liquid cooled plate near the liquid outlet 12, which can better meet the actual usage requirements.

As shown in FIG. 1, a liquid cooled plate is provided according to an embodiment of the present application. As shown in FIGS. 2 and 3, the liquid cooled plate includes multiple channels 1, and each of the channels 1 is provided with multiple partitions 2. Specifically, the partitions 2 are arranged along a direction in which the channel 1 extends, and the partitions 2 divide the channel 1 into multiple flow passages. With this arrangement, the coolant can be evenly distributed in the channel 1, which increases the heat exchange area of the liquid cooled plate, and thereby improving the heat exchange performance of the liquid cooled plate. The partitions 2 may include a first partition 21, a second partition 22 and a third partition 23. Specifically, the channel 1 in communication with the liquid inlet 11 may be provided with the first partition 21, the second partition 22 and the third partition 23. There may be multiple first partitions 21 and multiple second partitions 22, and the first partitions 21 and the second partitions 22 are respectively located at opposite sides of the third partition 23. The partition 2 is provided with a guide portion 24, the guide portion 24 is located at an end of the partition 2 close to the liquid inlet 11 of the channel 1, and the guide portion 24 is configured to make the coolant flow to both the two sides of the third partition 23. Specifically, each of the partitions 2 may be provided with the guide portion 24, so that the coolant can flow to the flow passages located at two sides in a width direction of the channel 1. Specifically, multiple first partitions 21 and multiple second partitions 22 may be provided, among the multiple first partitions 21, the greater a distance between one of the multiple first partitions 21 and the third partition 23 is, the greater a distance between the one of the multiple first partitions 21 and the liquid inlet 11 is; similarly, among the multiple second partitions 22, the greater a distance between one of the multiple second partitions 22 and the third partition 23 is, the greater a distance between the one of the multiple second partitions 22 and the liquid inlet 11 is.

The above arrangement can facilitate the uniform distribution of the coolant, which improves the heat exchange capacity of the liquid cooled plate, and thereby improving the heat dissipation effect and the uniformity of the temperature distribution of the heat sources at the liquid inlet 11.

The guide portion 24 is arranged at the end of the partition 2 close to the liquid inlet 11, such that when the coolant flows into the channel 1, the coolant gets into contact with the guide portion 24, and part of the coolant can flow along the guide portion 24. Generally, the liquid inlet 11 is centrally arranged relative to the channel 1, the coolant entering the channel 1 is guided by the guide portion 24 to flow into the flow passages located at two sides of the channel 1, which reduces the possibility of uneven distribution of the coolant in the flow passages at the middle and two sides.

In an embodiment, a thickness of the third partition 23 is greater than a thickness of each of the first partitions 21 or a thickness of each of the second partitions 22. Among the first partitions 21, the greater a distance between one of the first partitions 21 and the third partition 23 is, the smaller a thickness of the one of the first partition 21 is; among the second partitions 22, the greater a distance between one of the second partitions 22 and the third partition 23 is, the smaller a thickness of the one of the second partitions 22 is.

The third partition 23 has a relatively large thickness, which is beneficial to hinder flowing of the coolant, thereby facilitating the splitting of the coolant and the uniform distribution of the coolant. In a direction away from the third partition 23, the amount of the coolant gradually decreases, and the thicknesses of the first partitions 21 and the thicknesses of the second partitions 22 gradually decrease, which can reduce the obstruction of the partition 2 to the coolant, thereby facilitating the flow of the coolant.

As shown in FIG. 3, in an embodiment, the partition 2 may include multiple first partitions 21 and/or multiple second partitions 22.

With this arrangement, the channel 1 can be divided into multiple flow passages, which facilitates the uniform distribution of the coolant in the channel 1, thereby increasing the heat exchange area of the liquid cooled plate and improving the heat exchange performance of the liquid cooled plate.

In an embodiment, along an extension direction of the channels 1, the number of the partitions 2 in the channels 1 gradually increases or decreases. The extension direction of the channels 1 is the liquid flow direction. Specifically, along the liquid flow direction, densities of distribution of the partitions 2 in the multiple channels 1 gradually increase according to a preset rule.

With this arrangement, the cross-sectional area of a flow passage near the liquid outlet 12 can be reduced, which increases the outflow speed of the coolant, and increases the heat exchange area, and thereby improving the heat exchange capacity of the liquid cooled plate at the liquid outlet 12. Therefore, the overall heat exchange capacity of the liquid cooled plate is more balanced, and the temperature difference between the heat sources at the liquid inlet 11 and the heat sources at the liquid outlet 12 is reduced. When the liquid cooled plate is applied in an electronic computing device, the temperature difference between the chips 51 can be effectively controlled, so that all the chips 51 may have a similar temperature, which improves the overall work efficiency of the electronic computing device.

As shown in FIG. 3, in an embodiment, the distance between each of the first partitions 21 and the liquid inlet 11 of the channel 1, and the distance between each of the second partitions 22 and the liquid inlet 11 of the channel 1 gradually increase or decrease according to the preset rule. Specifically, along the direction away from the third partition 23, the greater the distance between each of the first partitions 21 or each of the second partitions 22 and the liquid inlet 11 of the channel 1 is, that is, the closer one of the partitions 2 is to one of two sides of the channel 1 in the width direction, the greater the distance between the partition 2 and the liquid inlet 11 is; the closer one of the partitions 2 is to the middle of the channel 1 in the width direction, the smaller the distance between the partition 2 and the liquid inlet 11 is.

This arrangement makes it convenient for the coolant to flow toward flow passages of the channel 1 located at two sides under the action of the guide portion 24, which reduces the possibility of unevenly distribution of the coolant caused by the coolant being hindered by the partitions 2 during flowing toward the two sides of the channel.

Specifically, as shown in FIG. 3, the first partitions 21 and the second partitions 22 may be symmetrically arranged with respect to the third partition 23, and this arrangement further facilitates the flowing of the coolant into the flow passages at the two sides.

As shown in FIG. 3, in an embodiment, the guide portion 24 is an inclined surface. Specifically, the partition 2 may be processed by bevel cutting, so as to form the inclined surface on the partition 2.

With the above arrangement, the structure is simple and easy to be processed. Moreover, this arrangement can also reduce the influence of the thickness of the partition 2 on the flowing of the coolant, which is beneficial for the coolant to flow into the flow passages rapidly, to reduce the possibility of accumulation and blocking of the coolant at the liquid inlet 11.

As shown in FIG. 3, in an embodiment, the inclined-surface shaped guide portion 24 of the first partition 21 is located at a side, away from the third partition 23, of the first partition 21; and the inclined-surface shaped guide portion 24 of the second partition 22 is located at a side, away from the third partition 23, of the second partition 22. The guide portion 24 is inclined toward the third partition 23. Specifically, the inclined surfaces of the first partitions 21 are located in a same plane, and inclined surfaces of the second partitions 22 are located in the a plane.

This arrangement makes it convenient for the coolant to flow along the guide portion 24 to the flow passages at two sides of the channel 1, so as to reduce the interference of the partitions 2 on the flowing of the coolant, which reduces the possibility of the situation that more coolant being distributed in the flow passages located in the middle and less in the flow passages at two sides of the channel 1, so that the overall distribution of the coolant is more uniform, thereby improving the overall heat exchange capacity of the liquid cooled plate.

Figure 5:
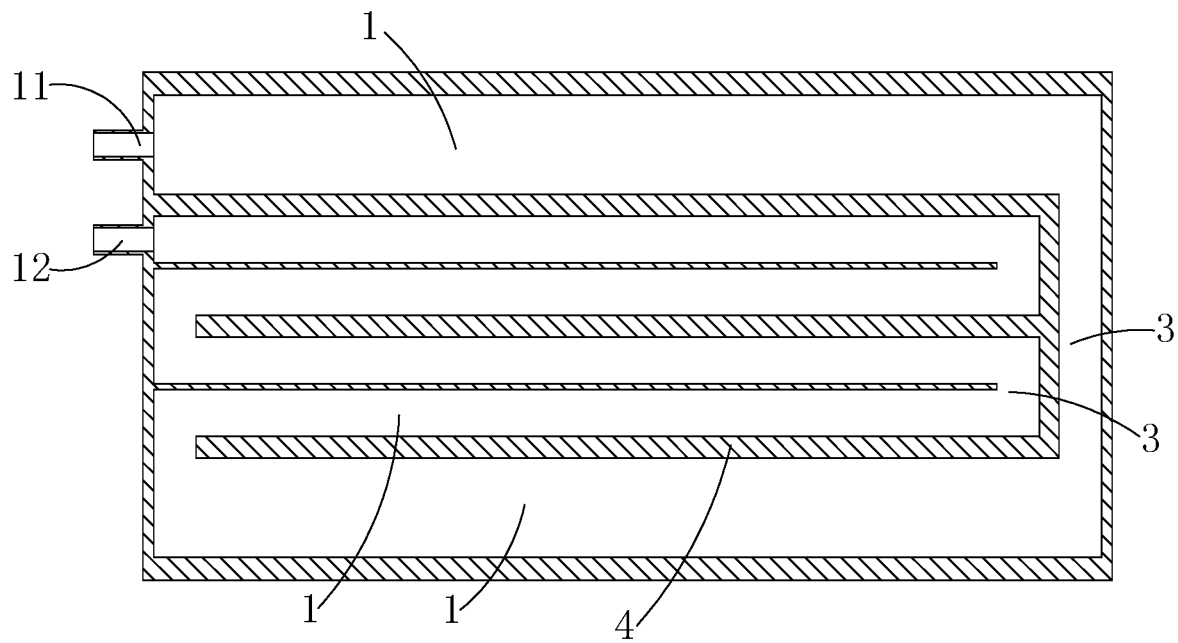
FIG. 5 is a schematic view showing structures of channels according to an embodiment of the present application.

As shown in FIG. 5, in an embodiment, the liquid cooled plate includes multiple channels 1, the multiple channels 1 are communicated in sequence, and a preset included angle is formed between each two adjacent channels 1.

Thus, the arrangement of the channels 1 can be adjusted, so that the channels 1 can be more evenly distributed inside the liquid cooled plate, thereby improving the overall heat exchange capacity of the liquid cooled plate.

In an embodiment, the liquid cooled plate includes multiple channels 1, and the channels 1 are arranged in parallel with each other.

This arrangement is beneficial for the coolant to flow uniformly in the multiple channels 1, which reduces the possibility that the coolant may be deviated to a certain side during flowing.

As shown in FIG. 5, in an embodiment, a cross-sectional area of the channel 1 gradually increases or decreases along the extension direction of the channel 1 according to a preset rule. Specifically, along the liquid flow direction, the cross-sectional area gradually decreases according to the preset rule, where the decreasing manner may be stepwise decreasing, that is, the cross-sectional areas of each two adjacent channels 1 are different; or the decreasing manner may be gradually decreasing, that is, the cross-sectional area of a same channel 1 gradually decreases. In an embodiment, a cross-sectional area of the second channel 14 may be half of a cross-sectional area of the first channel 13.

Since the channels 1 of the liquid cooled plate are connected in series, the flow quantity of the coolant in the channels 1 is the same. Therefore, when the cross-sectional area of the channel 1 decreases, the coolant has a higher flow speed in the channel 1, which increases the heat exchange coefficient of the channel 1 near the liquid outlet 12, thereby improving the heat exchange capacity of the channel 1 in this area, which is conducive to improving the overall heat exchange capacity of the liquid cooled plate, and thus can better meet the actual usage requirements.

Based on the liquid cooled plate provided according to the above embodiments, an electronic computing device is further provided according to the embodiments of the present application, and the electronic computing device includes the liquid cooled plate according to any one of the above embodiments. Since the liquid cooled plate has the above technical effects, the electronic computing device including the liquid cooled plate also has corresponding technical effects, which will not be repeated here.

Opposite sides of the liquid cooled plate in a thickness direction have a first surface and a second surface respectively, both of which may be configured to be in contact with the heat source (i.e., the chip set 5). This arrangement can increase the heat exchange area of the liquid cooled plate, and improve the heat exchange efficiency of the liquid cooled plate, which can better meet the actual usage requirements.

Figure 6:
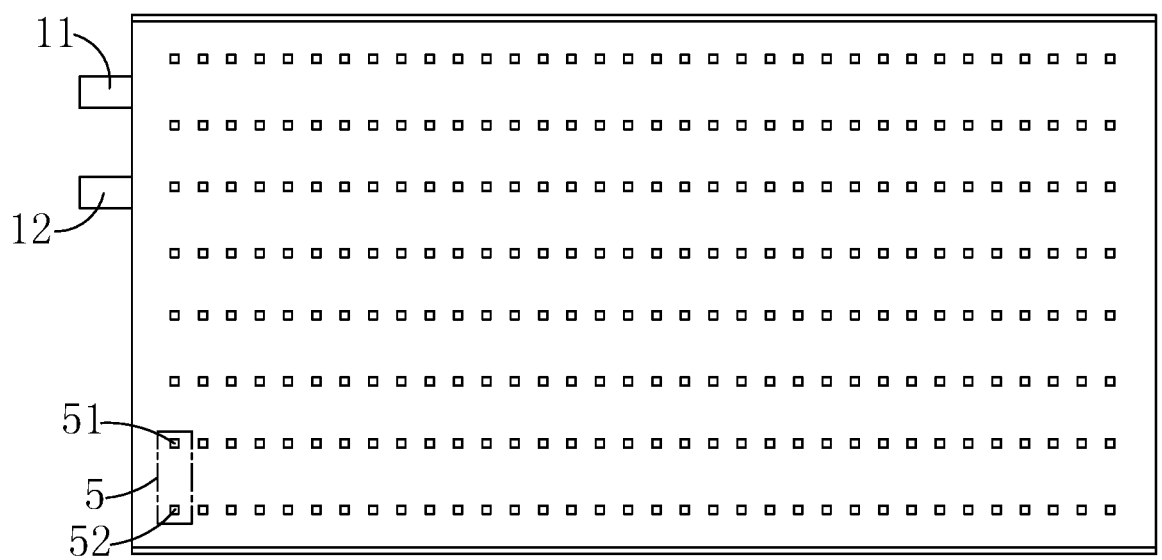
FIG. 6 is a schematic structural view showing a first implementation solution of the liquid cooled plate according to the embodiment of the present application.
Figure 7:
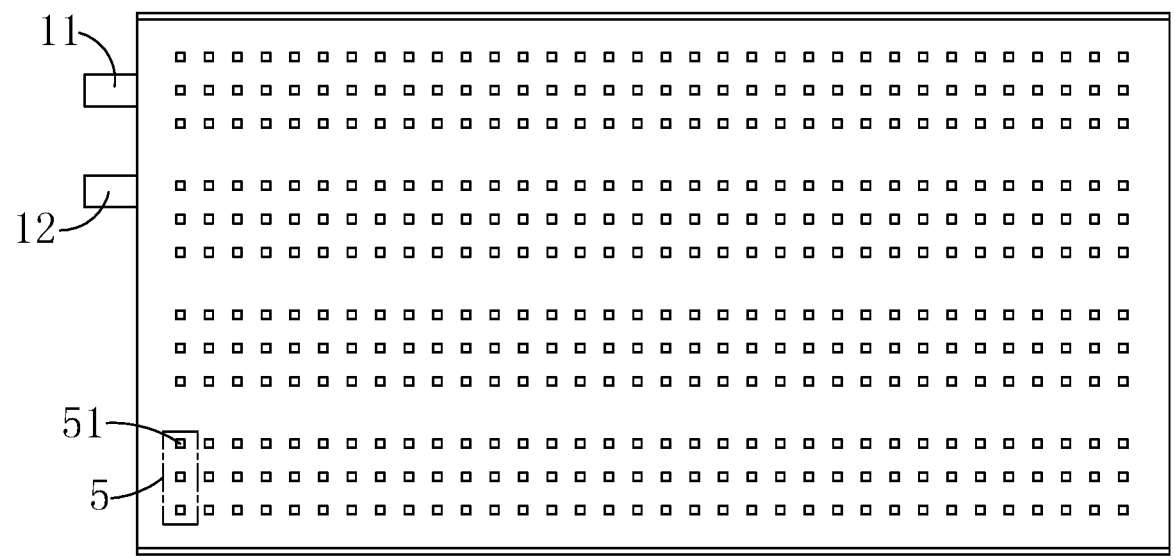
FIG. 7 is a schematic structural view showing a second implementation solution of the liquid cooled plate according to the embodiment of the present application.
Figure 8:
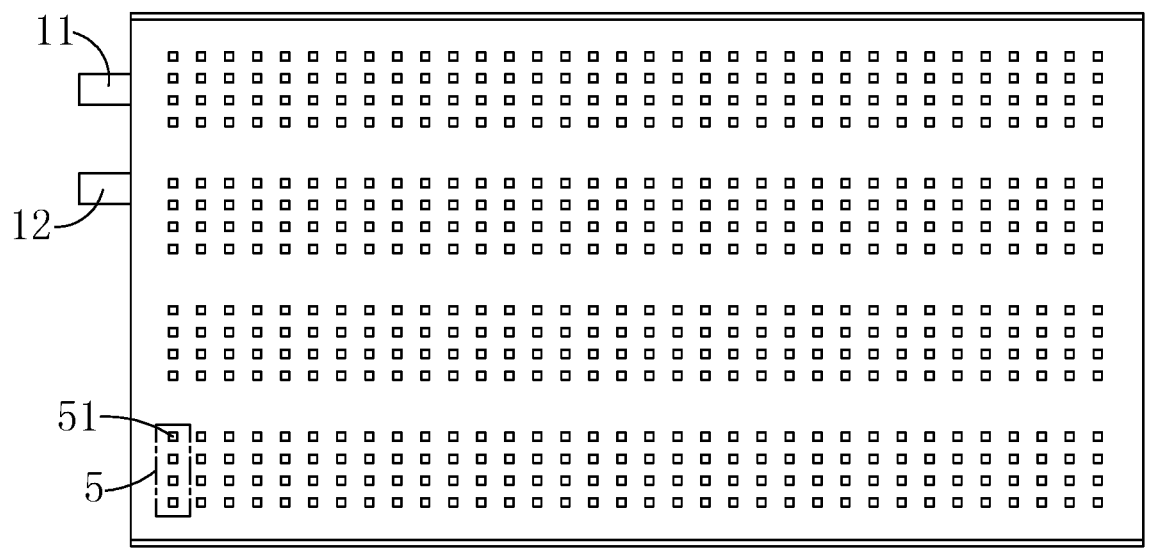
FIG. 8 is a schematic structural view showing a third implementation solution of the liquid cooled plate according to the embodiment of the present application.

As shown in FIG. 6 to FIG. 8, in an embodiment, the liquid cooled plate may be used to dissipate heat for the chip set 5 of the electronic computing device. The chip set 5 may include two, three, four or even more chips 51, and the chips 51 of the same chip set 5 are connected in parallel with each other. Specifically, in a projection in the thickness direction of the liquid cooled plate, the chips 51 of the same chip set 5 are located within a projection of the same channel 1.

With this arrangement, the chips 51 of the same chip set 5 may be in a similar temperature environment, so that the temperatures of the chips 51 of the same chip set 5 are the same or similar, which is beneficial to the overall operation of the electronic computing device.

The above embodiments are preferred embodiments of the present application, which are not intended to limit the present application, and those skilled in the art can make various modifications and variations to the present application. Any modifications, equivalent replacements and improvements made within the principle of the present application shall be within the protection scope of the present application.

The invention claimed is:

1. A liquid cooled plate, wherein a plurality of channels are formed in the liquid cooled plate, and the plurality of channels are communicated in sequence; and wherein
a plurality of partitions spaced apart from each other and extending in a liquid flow direction are arranged in each of the plurality of channels, each two adjacent channels of the plurality of channels are in communication with each other via a communicating portion, a part of each of the plurality of partitions in each of the plurality of channels extends into the communicating portion, and lengths of the parts of the plurality of partitions in each of the plurality of channels extending into the communicating portion increase or decrease in sequence in a preset direction;
the liquid cooled plate further comprises a liquid inlet and a liquid outlet; and wherein
the plurality of partitions in one of the plurality of channels which is in direct communication with the liquid inlet comprises a plurality of first partitions, a plurality of second partitions and a third partition; and the plurality of first partitions and the plurality of second partitions are located at opposite sides of the third partition; and among the plurality of first partitions, the greater a distance between one first partition and the third partition is, the greater a distance between the first partition and the liquid inlet is; among the plurality of second partitions, the greater a distance between one second partition and the third partition is, the greater a distance between the second partition and the liquid inlet is.

2. The liquid cooled plate according to claim 1, wherein in the liquid flow direction, at least one end of each of the plurality of partitions of each of the plurality of channels is provided with a guide portion.

3. The liquid cooled plate according to claim 2, wherein channels of the plurality of channels in communication with the liquid inlet are arranged along a peripheral direction of the liquid cooled plate to form a preset area, and channels of the plurality of channels in communication with the liquid outlet are located in the preset area.

4. An electronic computing device, comprising a plurality of heat sources and the liquid cooled plate according to claim 2, wherein the liquid cooled plate is configured to dissipate heat from the plurality of heat sources.

5. The liquid cooled plate according to claim 1, wherein the communicating portion is provided with a communicating portion partition, and a preset distance is provided between the plurality of partitions of each of the plurality of channels in communication with the communicating portion and the communicating portion partition in the communicating portion.

6. The liquid cooled plate according to claim 5, wherein channels of the plurality of channels in communication with the liquid inlet are arranged along a peripheral direction of the liquid cooled plate to form a preset area, and channels of the plurality of channels in communication with the liquid outlet are located in the preset area.

7. An electronic computing device, comprising a plurality of heat sources and the liquid cooled plate according to claim 5, wherein the liquid cooled plate is configured to dissipate heat from the plurality of heat sources.

8. The liquid cooled plate according to claim 1, wherein channels of the plurality of channels in communication with the liquid inlet are arranged along a peripheral direction of the liquid cooled plate to form a preset area, and channels of the plurality of channels in communication with the liquid outlet are located in the preset area.

9. The liquid cooled plate according to claim 8, wherein the liquid inlet and the liquid outlet are located on a same side of the liquid cooled plate, and one of the plurality of channels which is in direct communication with the liquid inlet and one of the plurality of channels which is in direct communication with the liquid outlet are arranged adjacently to each other.

10. The liquid cooled plate according to claim 1, wherein a thickness of the third partition is greater than that of each of the plurality of first partitions or that of each of the plurality of second partitions; and among the plurality of first partitions, the greater the distance between one first partition and the third partition is, the smaller a thickness of the first partition is; among the plurality of second partitions, the greater the distance between one second partition and the third partition is, the smaller a thickness of the second partition is.

11. The liquid cooled plate according to claim 1, wherein cross-sectional areas of the plurality of channels decrease in sequence in the liquid flow direction.

12. The liquid cooled plate according to claim 1, wherein a cross-sectional area of each of the plurality of channels decreases in the liquid flow direction.

13. The liquid cooled plate according to claim 1, wherein densities of distribution of the plurality of partitions in the plurality of channels increase in the liquid flow direction.

14. An electronic computing device, comprising a plurality of heat sources and the liquid cooled plate according to claim 1, wherein the liquid cooled plate is configured to dissipate heat from the plurality of heat sources.

* * * * *